United States Patent
Cretti et al.

(10) Patent No.: US 6,888,487 B2
(45) Date of Patent: May 3, 2005

(54) METHOD OF GENERATING A SWITCHING SEQUENCE FOR AN UNARY ARRAY OF CONDUCTING BRANCHES AND A RELATIVE THERMOMETRICALLY DECODED DIGITAL-TO-ANALOG CONVERTER

(75) Inventors: Francesco Cretti, Milan (IT); Fleana Albertoni, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/820,427

(22) Filed: Apr. 7, 2004

(65) Prior Publication Data

US 2005/0012650 A1 Jan. 20, 2005

(30) Foreign Application Priority Data

Apr. 7, 2003 (EP) ............................................. 03425218

(51) Int. Cl.$^7$ ............................................... H03M 1/66
(52) U.S. Cl. ....................................... 341/144; 341/119
(58) Field of Search .................................. 341/144, 119

(56) References Cited

U.S. PATENT DOCUMENTS

| | | | |
|---|---|---|---|
| 5,057,838 A | | 10/1991 | Tsuji et al. |
| 6,118,398 A | * | 9/2000 | Fisher et al. ................. 341/144 |
| 6,426,715 B1 | | 7/2002 | Westra et al. |

OTHER PUBLICATIONS

Geert A.M. Van Der Plas, et al.; "A 14–bit Intrinsic Accuracy $Q^2$ Random Walk CMOS DAC"; IEEE Journal of Solid-State Circuits; Dec. 1999; pp. 1708–1718; vol. 34, No. 12; IEEE; New York.

Yonghua Cong et al.; "Switching Sequence Optimization for Gradient Error Compensation in Thermometer–Decoded DAC Arrays"; IEEE Transaction on Circuits and Systems—II: Analog and digital Signal Processing; Jul. 2000; pp. 585–595; vol. 47, No. 7; IEEE; New York.

European Search Report dated Sep. 24, 2003.

* cited by examiner

*Primary Examiner*—Peguy Jeanpierre
*Assistant Examiner*—Joseph Lauture
(74) *Attorney, Agent, or Firm*—Lisa K. Jorgenson; Bryan A. Santarelli; Graybeal Jackson Haley LLP

(57) ABSTRACT

A method for determining switching sequences of two-dimensional unary arrays of conducting branches of thermometrically decoded D/A converters, in a way that will ensure that the relative INL error function be contained between pre-established symmetrical upper and lower bound functions, has been found. When these upper and lower bound functions are constant, the obtained switching sequence compensates both the linear and the quadratic component of the error distribution and therefore is affected by a very small absolute INL error, which depends essentially on the random component of the error distribution.

This method may be easily implemented by a computer program and allows the realization of thermometrically decoded D/A converters affected by a known limited INL error function.

22 Claims, 15 Drawing Sheets

| Switch position | 1 | 2 | 3 | 4 | 5 | 6 | 7 | 8 |
|---|---|---|---|---|---|---|---|---|
| ε (%) | -7 | -5 | -3 | -1 | 1 | 3 | 5 | 7 |
| Sequential sw. seq. | 1 | 2 | 3 | 4 | 5 | 6 | 7 | 8 |
| ε (%) | -7 | -5 | -3 | -1 | 1 | 3 | 5 | 7 |
| INL (%) | -7 | -12 | -15 | -16 | -15 | -12 | -7 | 0 |
| Symmetrical sw. seq. | 7 | 5 | 3 | 1 | 2 | 4 | 6 | 8 |
| ε (%) | -1 | +1 | -3 | +3 | -5 | +5 | -7 | +7 |
| INL (%) | +1 | 0 | +3 | 0 | +5 | 0 | +7 | 0 |

| a | | | |
|---|---|---|---|
| | | g | |
| | h | | |
| | | | b |

This work = 14-bit DAC

| 7 | 13 | 25 | 43 | 63 | 1 | 85 | 93 | 95 | 89 | 71 | 67 | 51 | 31 | 19 | 249 |
|---|---|---|---|---|---|---|---|---|---|---|---|---|---|---|---|
| 237 | 37 | 55 | 73 | 99 | 113 | 41 | 47 | 123 | 119 | 117 | 103 | 77 | 59 | 219 | 243 |
| 225 | 197 | 81 | 107 | 125 | 23 | 5 | 101 | 105 | 29 | 35 | 127 | 109 | 175 | 201 | 231 |
| 205 | 179 | 147 | 121 | 111 | 11 | 87 | 79 | 83 | 91 | 17 | 115 | 135 | 149 | 183 | 213 |
| 189 | 153 | 129 | 141 | 97 | 69 | 61 | 49 | 53 | 65 | 75 | 159 | 145 | 131 | 157 | 193 |
| 185 | 139 | 221 | 239 | 181 | 57 | 39 | 27 | 33 | 45 | 199 | 187 | 245 | 233 | 143 | 255 |
| 167 | 137 | 227 | 165 | 191 | 211 | 21 | 9 | 15 | 235 | 217 | 195 | 169 | 251 | 215 | 171 |
| 161 | 133 | 151 | 173 | 203 | 223 | 241 | 3 | 253 | 247 | 229 | 207 | 177 | 155 | 209 | 163 |
| 164 | 210 | 156 | 178 | 208 | 230 | 248 | 254 | 4 | 242 | 224 | 204 | 174 | 152 | 134 | 162 |
| 172 | 216 | 252 | 170 | 196 | 218 | 236 | 16 | 10 | 22 | 212 | 192 | 166 | 228 | 138 | 168 |
| 256 | 144 | 234 | 246 | 188 | 200 | 46 | 34 | 28 | 40 | 58 | 182 | 240 | 222 | 140 | 186 |
| 194 | 158 | 132 | 146 | 160 | 76 | 66 | 54 | 50 | 62 | 70 | 98 | 142 | 130 | 154 | 190 |
| 214 | 184 | 150 | 136 | 116 | 18 | 92 | 84 | 80 | 88 | 12 | 112 | 122 | 148 | 180 | 206 |
| 232 | 202 | 176 | 110 | 128 | 36 | 30 | 106 | 102 | 6 | 24 | 126 | 108 | 82 | 198 | 226 |
| 244 | 220 | 60 | 78 | 104 | 118 | 120 | 124 | 48 | 42 | 114 | 100 | 74 | 56 | 38 | 238 |
| 250 | 20 | 32 | 52 | 68 | 72 | 90 | 96 | 94 | 86 | 2 | 64 | 44 | 26 | 14 | 8 |

FIG. 5

| Row - Column | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| | 17 | 18 | 19 | 20 | 21 | 22 | 23 | 24 | 25 | 26 | 27 | 28 | 29 | 30 | 31 | 32 |
| | 33 | 34 | 35 | 36 | 37 | 38 | 39 | 40 | 41 | 42 | 43 | 44 | 45 | 46 | 47 | 48 |
| | 49 | 50 | 51 | 52 | 53 | 54 | 55 | 56 | 57 | 58 | 59 | 60 | 61 | 62 | 63 | 64 |
| | 65 | 66 | 67 | 68 | 69 | 70 | 71 | 72 | 73 | 74 | 75 | 76 | 77 | 78 | 79 | 80 |
| | 81 | 82 | 83 | 84 | 85 | 86 | 87 | 88 | 89 | 90 | 91 | 92 | 93 | 94 | 95 | 96 |
| | 97 | 98 | 99 | 100 | 101 | 102 | 103 | 104 | 105 | 106 | 107 | 108 | 109 | 110 | 111 | 112 |
| | 113 | 114 | 115 | 116 | 117 | 118 | 119 | 120 | 121 | 122 | 123 | 124 | 125 | 126 | 127 | 128 |
| | 129 | 130 | 131 | 132 | 133 | 134 | 135 | 136 | 137 | 138 | 139 | 140 | 141 | 142 | 143 | 144 |
| | 145 | 146 | 147 | 148 | 149 | 150 | 151 | 152 | 153 | 154 | 155 | 156 | 157 | 158 | 159 | 160 |
| | 161 | 162 | 163 | 164 | 165 | 166 | 167 | 168 | 169 | 170 | 171 | 172 | 173 | 174 | 175 | 176 |
| | 177 | 178 | 179 | 180 | 181 | 182 | 183 | 184 | 185 | 186 | 187 | 188 | 189 | 190 | 191 | 192 |
| | 193 | 194 | 195 | 196 | 197 | 198 | 199 | 200 | 201 | 202 | 203 | 204 | 205 | 206 | 207 | 208 |
| | 209 | 210 | 211 | 212 | 213 | 214 | 215 | 216 | 217 | 218 | 219 | 220 | 221 | 222 | 223 | 224 |
| | 225 | 226 | 227 | 228 | 229 | 230 | 231 | 232 | 233 | 234 | 235 | 236 | 237 | 238 | 239 | 240 |
| | 241 | 242 | 243 | 244 | 245 | 246 | 247 | 248 | 249 | 250 | 251 | 252 | 253 | 254 | 255 | 256 |

FIG. 6

(Prior Art)

Seq Row-Column Symm

| 255 | 253 | 251 | 249 | 247 | 245 | 243 | 241 | 239 | 237 | 235 | 233 | 231 | 229 | 227 | 225 |
|---|---|---|---|---|---|---|---|---|---|---|---|---|---|---|---|
| 223 | 221 | 219 | 217 | 215 | 213 | 211 | 209 | 207 | 205 | 203 | 201 | 199 | 197 | 195 | 193 |
| 191 | 189 | 187 | 185 | 183 | 181 | 179 | 177 | 175 | 173 | 171 | 169 | 167 | 165 | 163 | 161 |
| 159 | 157 | 155 | 153 | 151 | 149 | 147 | 145 | 143 | 141 | 139 | 137 | 135 | 133 | 131 | 129 |
| 127 | 125 | 123 | 121 | 119 | 117 | 115 | 113 | 111 | 109 | 107 | 105 | 103 | 101 | 99 | 97 |
| 95 | 93 | 91 | 89 | 87 | 85 | 83 | 81 | 79 | 77 | 75 | 73 | 71 | 69 | 67 | 65 |
| 63 | 61 | 59 | 57 | 55 | 53 | 51 | 49 | 47 | 45 | 43 | 41 | 39 | 37 | 35 | 33 |
| 31 | 29 | 27 | 25 | 23 | 21 | 19 | 17 | 15 | 13 | 11 | 9 | 7 | 5 | 3 | 1 |
| 2 | 4 | 6 | 8 | 10 | 12 | 14 | 16 | 18 | 20 | 22 | 24 | 26 | 28 | 30 | 32 |
| 34 | 36 | 38 | 40 | 42 | 44 | 46 | 48 | 50 | 52 | 54 | 56 | 58 | 60 | 62 | 64 |
| 66 | 68 | 70 | 72 | 74 | 76 | 78 | 80 | 82 | 84 | 86 | 88 | 90 | 92 | 94 | 96 |
| 98 | 100 | 102 | 104 | 106 | 108 | 110 | 112 | 114 | 116 | 118 | 120 | 122 | 124 | 126 | 128 |
| 130 | 132 | 134 | 136 | 138 | 140 | 142 | 144 | 146 | 148 | 150 | 152 | 154 | 156 | 158 | 160 |
| 162 | 164 | 166 | 168 | 170 | 172 | 174 | 176 | 178 | 180 | 182 | 184 | 186 | 188 | 190 | 192 |
| 194 | 196 | 198 | 200 | 202 | 204 | 206 | 208 | 210 | 212 | 214 | 216 | 218 | 220 | 222 | 224 |
| 226 | 228 | 230 | 232 | 234 | 236 | 238 | 240 | 242 | 244 | 246 | 248 | 250 | 252 | 254 | 256 |

FIG. 7
(Prior Art)

12-bit DAC

| 222 | 158 | 94 | 30 | 62 | 126 | 190 | 254 | 250 | 186 | 122 | 58 | 26 | 90 | 154 | 218 |
|---|---|---|---|---|---|---|---|---|---|---|---|---|---|---|---|
| 214 | 150 | 86 | 22 | 54 | 118 | 182 | 246 | 242 | 178 | 114 | 50 | 18 | 82 | 146 | 210 |
| 206 | 142 | 78 | 14 | 46 | 110 | 174 | 238 | 234 | 170 | 106 | 42 | 10 | 74 | 138 | 202 |
| 198 | 134 | 70 | 6 | 38 | 102 | 166 | 230 | 226 | 162 | 98 | 34 | 2 | 66 | 130 | 194 |
| 229 | 165 | 101 | 37 | 5 | 69 | 133 | 197 | 193 | 129 | 65 | 1 | 33 | 97 | 161 | 225 |
| 237 | 173 | 109 | 45 | 13 | 77 | 141 | 205 | 201 | 137 | 73 | 9 | 41 | 105 | 169 | 233 |
| 245 | 181 | 117 | 53 | 21 | 85 | 149 | 213 | 209 | 145 | 81 | 17 | 49 | 113 | 177 | 241 |
| 253 | 189 | 125 | 61 | 29 | 93 | 157 | 221 | 217 | 153 | 89 | 25 | 57 | 121 | 185 | 249 |
| 251 | 187 | 123 | 59 | 27 | 91 | 155 | 219 | 223 | 159 | 95 | 31 | 63 | 127 | 191 | 255 |
| 243 | 179 | 115 | 51 | 19 | 83 | 147 | 211 | 215 | 151 | 87 | 23 | 55 | 119 | 183 | 247 |
| 235 | 171 | 107 | 43 | 11 | 75 | 139 | 203 | 207 | 143 | 79 | 15 | 47 | 111 | 175 | 239 |
| 227 | 163 | 99 | 35 | 3 | 67 | 131 | 195 | 199 | 135 | 71 | 7 | 39 | 103 | 167 | 231 |
| 196 | 132 | 68 | 4 | 36 | 100 | 164 | 228 | 232 | 168 | 104 | 40 | 8 | 72 | 136 | 200 |
| 204 | 140 | 76 | 12 | 44 | 108 | 172 | 236 | 240 | 176 | 112 | 48 | 16 | 80 | 144 | 208 |
| 212 | 148 | 84 | 20 | 52 | 116 | 180 | 244 | 248 | 184 | 120 | 56 | 24 | 88 | 152 | 216 |
| 220 | 156 | 92 | 28 | 60 | 124 | 188 | 252 | 256 | 192 | 128 | 64 | 32 | 96 | 160 | 224 |

FIG. 8

(Prior Art)

Q2 Random Walk

| 39 | 71 | 151 | 215 | 43 | 75 | 155 | 219 | 36 | 68 | 148 | 212 | 47 | 79 | 159 | 223 |
|---|---|---|---|---|---|---|---|---|---|---|---|---|---|---|---|
| 103 | 231 | 23 | 183 | 107 | 235 | 27 | 187 | 100 | 228 | 20 | 180 | 111 | 239 | 31 | 191 |
| 167 | 7 | 247 | 119 | 171 | 11 | 251 | 123 | 164 | 4 | 244 | 116 | 175 | 15 | 255 | 127 |
| 199 | 135 | 87 | 55 | 203 | 139 | 91 | 59 | 196 | 132 | 84 | 52 | 207 | 143 | 95 | 63 |
| 35 | 67 | 147 | 211 | 41 | 73 | 153 | 217 | 45 | 77 | 157 | 221 | 34 | 66 | 146 | 210 |
| 99 | 227 | 19 | 179 | 105 | 233 | 25 | 185 | 109 | 237 | 29 | 189 | 98 | 226 | 18 | 178 |
| 163 | 3 | 243 | 115 | 169 | 9 | 249 | 121 | 173 | 13 | 253 | 125 | 162 | 2 | 242 | 114 |
| 195 | 131 | 83 | 51 | 201 | 137 | 89 | 57 | 205 | 141 | 93 | 61 | 194 | 130 | 82 | 50 |
| 48 | 80 | 160 | 224 | 33 | 65 | 145 | 209 | 40 | 72 | 152 | 216 | 38 | 70 | 150 | 214 |
| 112 | 240 | 32 | 192 | 97 | 225 | 17 | 177 | 104 | 232 | 24 | 184 | 102 | 230 | 22 | 182 |
| 176 | 16 | 256 | 128 | 161 | 1 | 241 | 113 | 168 | 8 | 248 | 120 | 166 | 6 | 246 | 118 |
| 208 | 144 | 96 | 64 | 193 | 129 | 81 | 49 | 200 | 136 | 88 | 56 | 198 | 134 | 86 | 54 |
| 37 | 69 | 149 | 213 | 46 | 78 | 158 | 222 | 44 | 76 | 156 | 220 | 42 | 74 | 154 | 218 |
| 101 | 229 | 21 | 181 | 110 | 238 | 30 | 190 | 108 | 236 | 28 | 188 | 106 | 234 | 26 | 186 |
| 165 | 5 | 245 | 117 | 174 | 14 | 254 | 126 | 172 | 12 | 252 | 124 | 170 | 10 | 250 | 122 |
| 197 | 133 | 85 | 53 | 206 | 142 | 94 | 62 | 204 | 140 | 92 | 60 | 202 | 138 | 90 | 58 |

FIG. 9
(Prior Art)

INL-bounded

| 206 | 174 | 30 | 62 | 195 | 163 | 19 | 51 | 199 | 167 | 23 | 55 | 196 | 164 | 20 | 52 |
|---|---|---|---|---|---|---|---|---|---|---|---|---|---|---|---|
| 238 | 142 | 126 | 94 | 227 | 131 | 115 | 83 | 231 | 135 | 119 | 87 | 228 | 132 | 116 | 84 |
| 110 | 14 | 254 | 222 | 99 | 3 | 243 | 211 | 103 | 7 | 247 | 215 | 100 | 4 | 244 | 212 |
| 78 | 46 | 158 | 190 | 67 | 35 | 147 | 179 | 71 | 39 | 151 | 183 | 68 | 36 | 148 | 180 |
| 193 | 161 | 17 | 49 | 208 | 176 | 32 | 64 | 205 | 173 | 29 | 61 | 204 | 172 | 28 | 60 |
| 225 | 129 | 113 | 81 | 240 | 144 | 128 | 96 | 237 | 141 | 125 | 93 | 236 | 140 | 124 | 92 |
| 97 | 1 | 241 | 209 | 112 | 16 | 256 | 224 | 109 | 13 | 253 | 221 | 108 | 12 | 252 | 220 |
| 65 | 33 | 145 | 177 | 80 | 48 | 160 | 192 | 77 | 45 | 157 | 189 | 76 | 44 | 156 | 188 |
| 201 | 169 | 25 | 57 | 197 | 165 | 21 | 53 | 202 | 170 | 26 | 58 | 200 | 168 | 24 | 56 |
| 233 | 137 | 121 | 89 | 229 | 133 | 117 | 85 | 234 | 138 | 122 | 90 | 232 | 136 | 120 | 88 |
| 105 | 9 | 249 | 217 | 101 | 5 | 245 | 213 | 106 | 10 | 250 | 218 | 104 | 8 | 248 | 216 |
| 73 | 41 | 153 | 185 | 69 | 37 | 149 | 181 | 74 | 42 | 154 | 186 | 72 | 40 | 152 | 184 |
| 203 | 171 | 27 | 59 | 198 | 166 | 22 | 54 | 194 | 162 | 18 | 50 | 207 | 175 | 31 | 63 |
| 235 | 139 | 123 | 91 | 230 | 134 | 118 | 86 | 226 | 130 | 114 | 82 | 239 | 143 | 127 | 95 |
| 107 | 11 | 251 | 219 | 102 | 6 | 246 | 214 | 98 | 2 | 242 | 210 | 111 | 15 | 255 | 223 |
| 75 | 43 | 155 | 187 | 70 | 38 | 150 | 182 | 66 | 34 | 146 | 178 | 79 | 47 | 159 | 191 |

FIG. 10
(Prior Art)

best of 1000 random

| 61 | 69 | 120 | 17 | 133 | 83 | 200 | 88 | 245 | 86 | 241 | 223 | 141 | 76 | 228 | 99 |
|---|---|---|---|---|---|---|---|---|---|---|---|---|---|---|---|
| 137 | 24 | 80 | 15 | 226 | 46 | 181 | 93 | 144 | 108 | 161 | 102 | 16 | 29 | 256 | 100 |
| 250 | 197 | 158 | 98 | 138 | 85 | 215 | 164 | 186 | 89 | 238 | 187 | 193 | 4 | 110 | 94 |
| 52 | 131 | 221 | 190 | 227 | 175 | 183 | 167 | 43 | 163 | 10 | 11 | 235 | 165 | 156 | 113 |
| 213 | 147 | 101 | 92 | 210 | 18 | 254 | 95 | 111 | 3 | 224 | 134 | 145 | 75 | 116 | 231 |
| 72 | 206 | 135 | 31 | 162 | 36 | 149 | 62 | 35 | 7 | 107 | 189 | 251 | 168 | 105 | 178 |
| 219 | 19 | 8 | 63 | 194 | 27 | 170 | 146 | 41 | 124 | 125 | 152 | 53 | 54 | 237 | 56 |
| 55 | 28 | 229 | 44 | 179 | 171 | 177 | 73 | 249 | 176 | 1 | 208 | 22 | 174 | 234 | 60 |
| 244 | 39 | 204 | 247 | 202 | 184 | 236 | 121 | 122 | 23 | 42 | 217 | 79 | 67 | 5 | 38 |
| 58 | 212 | 21 | 64 | 157 | 129 | 203 | 150 | 26 | 139 | 14 | 142 | 166 | 230 | 48 | 195 |
| 191 | 126 | 132 | 97 | 140 | 106 | 104 | 45 | 248 | 196 | 34 | 218 | 240 | 153 | 68 | 59 |
| 220 | 47 | 51 | 205 | 185 | 13 | 9 | 71 | 117 | 128 | 211 | 66 | 30 | 12 | 199 | 155 |
| 118 | 169 | 246 | 173 | 225 | 207 | 136 | 180 | 81 | 232 | 222 | 82 | 253 | 78 | 77 | 160 |
| 123 | 209 | 57 | 96 | 114 | 91 | 242 | 214 | 70 | 233 | 84 | 216 | 40 | 192 | 65 | 252 |
| 130 | 182 | 143 | 154 | 6 | 119 | 198 | 74 | 159 | 201 | 20 | 2 | 49 | 127 | 188 | 50 |
| 151 | 103 | 25 | 172 | 239 | 90 | 33 | 148 | 243 | 255 | 87 | 32 | 115 | 37 | 112 | 109 |

FIG. 11
(Prior Art)

Magic

| 256 | 2 | 3 | 253 | 252 | 6 | 7 | 249 | 248 | 10 | 11 | 245 | 244 | 14 | 15 | 241 |
|---|---|---|---|---|---|---|---|---|---|---|---|---|---|---|---|
| 17 | 239 | 238 | 20 | 21 | 235 | 234 | 24 | 25 | 231 | 230 | 28 | 29 | 227 | 226 | 32 |
| 33 | 223 | 222 | 36 | 37 | 219 | 218 | 40 | 41 | 215 | 214 | 44 | 45 | 211 | 210 | 48 |
| 208 | 50 | 51 | 205 | 204 | 54 | 55 | 201 | 200 | 58 | 59 | 197 | 196 | 62 | 63 | 193 |
| 192 | 66 | 67 | 189 | 188 | 70 | 71 | 185 | 184 | 74 | 75 | 181 | 180 | 78 | 79 | 177 |
| 81 | 175 | 174 | 84 | 85 | 171 | 170 | 88 | 89 | 167 | 166 | 92 | 93 | 163 | 162 | 96 |
| 97 | 159 | 158 | 100 | 101 | 155 | 154 | 104 | 105 | 151 | 150 | 108 | 109 | 147 | 146 | 112 |
| 144 | 114 | 115 | 141 | 140 | 118 | 119 | 137 | 136 | 122 | 123 | 133 | 132 | 126 | 127 | 129 |
| 128 | 130 | 131 | 125 | 124 | 134 | 135 | 121 | 120 | 138 | 139 | 117 | 116 | 142 | 143 | 113 |
| 145 | 111 | 110 | 148 | 149 | 107 | 106 | 152 | 153 | 103 | 102 | 156 | 157 | 99 | 98 | 160 |
| 161 | 95 | 94 | 164 | 165 | 91 | 90 | 168 | 169 | 87 | 86 | 172 | 173 | 83 | 82 | 176 |
| 80 | 178 | 179 | 77 | 76 | 182 | 183 | 73 | 72 | 186 | 187 | 69 | 68 | 190 | 191 | 65 |
| 64 | 194 | 195 | 61 | 60 | 198 | 199 | 57 | 56 | 202 | 203 | 53 | 52 | 206 | 207 | 49 |
| 209 | 47 | 46 | 212 | 213 | 43 | 42 | 216 | 217 | 39 | 38 | 220 | 221 | 35 | 34 | 224 |
| 225 | 31 | 30 | 228 | 229 | 27 | 26 | 232 | 233 | 23 | 22 | 236 | 237 | 19 | 18 | 240 |
| 16 | 242 | 243 | 13 | 12 | 246 | 247 | 9 | 8 | 250 | 251 | 5 | 4 | 254 | 255 | 1 |

FIG. 12
(Prior Art)

Modified Magic

| 253 | 9 | 237 | 25 | 33 | 213 | 49 | 197 | 254 | 10 | 238 | 26 | 34 | 214 | 50 | 198 |
|---|---|---|---|---|---|---|---|---|---|---|---|---|---|---|---|
| 65 | 181 | 81 | 165 | 157 | 105 | 141 | 121 | 66 | 182 | 82 | 166 | 158 | 106 | 142 | 122 |
| 125 | 137 | 109 | 153 | 161 | 85 | 177 | 69 | 126 | 138 | 110 | 154 | 162 | 86 | 178 | 70 |
| 193 | 53 | 209 | 37 | 29 | 233 | 13 | 249 | 194 | 54 | 210 | 38 | 30 | 234 | 14 | 250 |
| 5 | 241 | 21 | 225 | 217 | 45 | 201 | 61 | 6 | 242 | 22 | 226 | 218 | 46 | 202 | 62 |
| 185 | 77 | 169 | 93 | 101 | 145 | 117 | 129 | 186 | 78 | 170 | 94 | 102 | 146 | 118 | 130 |
| 133 | 113 | 149 | 97 | 89 | 173 | 73 | 189 | 134 | 114 | 150 | 98 | 90 | 174 | 74 | 190 |
| 57 | 205 | 41 | 221 | 229 | 17 | 245 | 1 | 58 | 206 | 42 | 222 | 230 | 18 | 246 | 2 |
| 255 | 11 | 239 | 27 | 35 | 215 | 51 | 199 | 256 | 12 | 240 | 28 | 36 | 216 | 52 | 200 |
| 67 | 183 | 83 | 167 | 159 | 107 | 143 | 123 | 68 | 184 | 84 | 168 | 160 | 108 | 144 | 124 |
| 127 | 139 | 111 | 155 | 163 | 87 | 179 | 71 | 128 | 140 | 112 | 156 | 164 | 88 | 180 | 72 |
| 195 | 55 | 211 | 39 | 31 | 235 | 15 | 251 | 196 | 56 | 212 | 40 | 32 | 236 | 16 | 252 |
| 7 | 243 | 23 | 227 | 219 | 47 | 203 | 63 | 8 | 244 | 24 | 228 | 220 | 48 | 204 | 64 |
| 187 | 79 | 171 | 95 | 103 | 147 | 119 | 131 | 188 | 80 | 172 | 96 | 104 | 148 | 120 | 132 |
| 135 | 115 | 151 | 99 | 91 | 175 | 75 | 191 | 136 | 116 | 152 | 100 | 92 | 176 | 76 | 192 |
| 59 | 207 | 43 | 223 | 231 | 19 | 247 | 3 | 60 | 208 | 44 | 224 | 232 | 20 | 248 | 4 |

FIG. 13

(Prior Art)

| 16 x 16 matrix comparison result ($g_i = g_q = 0.5$) | | |
|---|---|---|
| Row-Col | Algorithm/Sequence | Maximum absolute INL |
| | Row-Column basic | 38.1 |
| | Row-Column symm. Seq. | 20 |
| | Row-Column hier symm seq. [2] | 10.2 |
| Hierarchic. | 12-bit C05 DAC | 5.9 |
| | Q2 random walk [1] | 2.8 |
| | Hier. switch, INL-bounded [2] | 1.93 |
| Improvements | Random (1 trial) | 6.8 |
| | Random (best of 1k trials) | 3.4 |
| | Magic | 10.2 |
| | Modified Magic | 2.6 |
| | This work | 0.96 |

FIG. 16

| Maximum absolute INL error | | | |
|---|---|---|---|
| $g_i =$ | 0.3 | 0.5 | 0.7 |
| $g_q =$ | 0.7 | 0.5 | 0.3 |
| $Q^2$ rand walk | 2.26 | 2.8 | 3.38 |
| INL-bounded | 1.56 | 1.93 | 2.4 |
| This work | 0.95 | 0.96 | 1.04 |

METHOD OF GENERATING A SWITCHING SEQUENCE FOR AN UNARY ARRAY OF CONDUCTING BRANCHES AND A RELATIVE THERMOMETRICALLY DECODED DIGITAL-TO-ANALOG CONVERTER

PRIORITY CLAIM

This application claims priority from European Patent Application No. 03425218.9 filed on Apr. 7, 2003, which is incorporated herein by reference.

FIELD OF THE INVENTION

An embodiment of the present invention relates generally to digital-analog converters and in particular to a method of generating a switching sequence for an unary array of conducting branches and a relative thermometrically decoded digital-to-analog converter having a desired integral non-linearity (briefly INL) error function.

BACKGROUND OF THE INVENTION

Digital-analog (D/A) converters are widely used in many applications, such as wireless communications, signal reconstruction, waveforms generation etc. Basically, a D/A converter may be realized with an array of conducting branches that generate binary weighted constant currents (binary array) and/or identical currents (unary array). These conducting branches may include capacitors or current generators, selectable by respective switches for delivering current toward a summing line or toward ground.

For sake of simplicity, let us refer to a D/A converter, the conducting branches of which are realized with current generators, though what will be said will hold, mutatis mutandis, also for conducting branches realized with switched capacitors.

The conducting branches of a binary array are selected by respective bits of an input bit string, while the conducting branches of an unary array are selected according to a fixed switching sequence for making the unary array generate a total current corresponding to the input digital value.

For better comprehending the field of utility of an embodiment of this invention, let us refer to the so-called segmented converters, which generally have a binary weighted array of conducting branches, selected by the least significant bits of an input digital string, and an unary array that delivers a current corresponding, to the digital value represented by the most significant bits, that is according to a so-called thermometer or thermometric decoding.

A sample unary array is depicted in FIG. 1. As may be noticed, the current generators are selected according to a certain switching sequence and the output current Iout corresponds to the sum of the currents circulating in the selected branches. Optionally, there may be a "dummy" area in the unary array, which may be used for realizing biasing circuits. In segmented digital-to-analog converters, the "dummy" area may be used for realizing a binary array.

When the digital input value to be converted by the unary array represents a certain number n, the current generators of the unary array from 1 to n are switched on, thus generating an output current Iout proportional to the digital input number n.

Ideally, a D/A converter should generate an output signal that varies linearly with the input bit string, which would happen if all the conducting branches were identical. Unfortunately, mismatches between conducting branches due to inaccuracies of the fabrication process (process spread), make the current delivered by each branch not exactly equal to the design value, but affected by an error that may depend on the position of the conducting branch on the silicon substrate.

In general, unary arrays are affected by a differential non-linearity (INL) error and by an integral non-linearity (INL) error.

Indicating with $\bar{I}$ the average current delivered by the branches of an unary array and with $I_j$ the current delivered by the j-th branch of the array in the switching sequence, $$I_j = \bar{I} \cdot (1 + \epsilon_j)$$

wherein $\epsilon_j$ is the relative deviation of the current $I_j$ from the average current $\bar{I}$.

In an unary array not having a dummy area, the DNL error of the k-th branch in the switching sequence is $$DNL(k) = \epsilon_k$$

which represents a non-uniform deviation in the ideal current step amplitude between adjacent bit strings.

The INL error function is defined as $$INL(k) = \sum_{j=1}^{k} \epsilon_j$$

and gives the deviation of the real analog output signal from its ideal value as a percentage of the average current $\bar{I}$ for any value "k" of the switching sequence.

The absolute INL error of a switching sequence is the maximum absolute value of the relative INL error function.

An introduction on the INL and DNL errors of an unary array of a D/A thermometrically decoded converter is carried out in the article by Y. Cong and R. L. Geiger "Switching Sequence Optimization for Gradient Error Compensation in Thermometer-Decoded DAC Arrays", *IEEE Trans. on circuits and systems—II: analog and digital signal processing*, Vol. 47, No. 7, pages 585–595, July 2000.

The DNL error of a branch can be reduced only by reducing the process spread and is independent from the switching sequence. By contrast, the INL error function strongly depends on the switching sequence, as it may be easily inferred from the following example.

Two possible switching sequences of a mono-dimensional unary array having eight conducting branches are shown in FIG. 1A. The conducting branches are affected by the indicated DNL errors ($\epsilon$). The absolute values of the underlined numbers are the absolute INL errors of the switching sequences.

As may be noticed, the INL error function of the sequential switching sequence shows a maximum deviation of the analog output from its ideal value in the middle of the sequence. This situation is inconvenient, because the digital values input to a D/A converter are more likely in the middle of the range of conversion, rather than at the two ends thereof. Therefore, it is more convenient to switch the mono-dimensional array of conducting branches of FIG. 1A according to a symmetrical sequence than according to a sequential sequence. Moreover, the absolute INL error for the symmetrical sequence is 7, while for the sequential sequence is 16.

In this very simple case, it is possible to determine by successive trials the switching sequence with the smallest absolute INL error, but for two-dimensional unary arrays of approximately one thousand conducting branches, the number of combinations is too large for determining a switching sequence with the desired INL error function by trials.

Many different methods of determining a switching sequence of a two dimensional unary array of conducting branches and a relative D/A converter have been proposed.

The patent U.S. Pat. No. 6,118,398 by G. J. Fisher et al. discloses a digital-analog converter having an unary array of current sources that are selected according to a sequence that ensures a relatively small absolute integral non-linearity error. The suggested switching sequence is substantially a mixed symmetrical sequence, in which the current sources that are in the middle of the array have median positions in the switching sequence, while current sources that are in borderline regions of the array are at the beginning or at the end of the sequence.

The patent U.S. Pat. No. 5,057,838 by K. Tsuji et al. discloses a D/A converter having a plurality of conducting branches of a two-dimensional array, wherein the switching sequence is determined in order to make the center of the current contributions delivered by the conducting branches of the array coincide with the center of the array.

The document "A 14-bit Intrinsic Accuracy Q2 Random Walk CMOS DAC" by Van der Plas, Steyaert et al., JSCC 12 Dec. 1999, discloses a method of determining the switching sequence of the switches of a D/A converter organized in matrix form, exploiting the so-called "$Q^2$ random walk" algorithm.

The document "Switching Sequence Optimization for Gradient Error Compensation in Thermometer-Decoded DAC Arrays", by Cong, Geiger, JSSC 7 Jul. 2000, discloses an algorithm to find the so-called "INL bounded" switching sequence for an unary array of branches organized in matrix form.

Unfortunately, the absolute INL errors of the D/A converters realized with the above techniques remain relatively large.

SUMMARY OF THE INVENTION

As will be more clearly described hereinafter, the array of conducting branches is affected by an error whose spatial distribution has an anti-symmetrical linear component, a quadratic symmetrical component, components of higher orders and a random component. The known thermometrically decoded converters are affected by quite large INL errors because the switching sequence of their unary array of conducting branches is not determined in a way that would optimally compensate the quadratic component of the error distribution.

An embodiment of a method according to the invention determines switching sequences of two-dimensional unary arrays of conducting branches of thermometrically decoded D/A converters, in a way that will ensure that the relative INL error function is contained between pre-established symmetrical upper and lower bound functions. These functions may be constant, such to ensure an absolute INL error smaller than a pre-established value, or approaching zero in correspondence of midway values of the switching sequence from a certain maximum value in correspondence of the two ends of the range of conversion. This last solution is preferable when the D/A converter is likely to work almost constantly about the, middle of its range of conversion.

When these upper and lower bound functions are constant, the obtained switching sequence compensates both the linear and the quadratic component of the error distribution and therefore is affected by a very small absolute INL error, which depends essentially on the random component of the error distribution.

An embodiment of a method according to the invention may be easily implemented by a computer program and allows the realization of thermometrically decoded D/A converters affected by a known limited INL error function.

BRIEF DESCRIPTION OF THE DRAWINGS

The advantages of embodiments of this invention will become more evident through a detailed description referring to the attached drawings, wherein:

FIG. 5 depicts a switching sequence determined by using an embodiment of the method of this invention for a 16×16 unary array;

FIG. 6 depicts a sequential switching sequence for a 16×16 unary array according to a prior art method;

FIG. 7 depicts a symmetrical switching sequence for a 16×16 unary array according to a prior art method;

FIG. 8 depicts a switching sequence for a 16×16 unary array of the 12-bit thermometrically decoded D/A converter embedded in the commercial devices MTC-xx154, MTC-xx174 and MTC-xx454 of Alcatel Microelectronics according to a prior art method;

FIG. 9 depicts a switching sequence for a 16×16 unary array determined with a $Q^2$ random walk algorithm according to a prior art method;

FIG. 10 depicts an "INL bounded" switching sequence for a 16×16 unary array according to a prior art method;

FIG. 11 depicts a random switching sequence for a 16×16 unary array according to a prior art method;

FIG. 12 depicts an anti-symmetrical switching sequence in respect to the center of a 16×16 unary array according to a prior art method;

FIG. 13 depicts an improved anti-symmetrical switching sequence in respect to the center of a 16×16 unary array according to a prior art method;

FIGS. 16 and 17 compare the maximum values of the absolute INL errors of many switching sequences obtained with known methods and an embodiment of the method of the invention for different values of the linear $g_l$ and quadratic $g_q$ coefficients; and FIG. 18 depicts the switching sequence of an unary array of 1024 conducting branches of a 14-bit D/A converter of an embodiment of this invention, ten of which are thermometrically decoded.

DETAILED DESCRIPTION

Before illustrating a method according to an embodiment of this invention, it is necessary to make some mathematical considerations.

As stated hereinbefore, the conducting branches of an array are affected by an error, which in electronic equipment may be due to thermal and/or mechanical phenomena, doping differences, and other process spread mechanisms of inaccuracy, distributed according to an error distribution function over the array.

In general, for a two-dimensional disposition of conducting branches, the relative error distribution $\epsilon(x,y)$ may be approximated by a Taylor series expansion:

$$\epsilon(x,y)=a_0+a_{11}x+a_{12}y+a_{21}x^2+a_{22}y^2+a_{23}xy+\ldots$$

Truncating this series at the second order, neglecting the term $a_{23}xy$ and supposing that $a_{21}=a_{22}$, the linear $\epsilon_l(x,y)$, quadratic $\epsilon_q(x,y)$ and joint $\epsilon_j(x,y)$ error distribution functions are, respectively, $$\epsilon_l(x,y)=g_l\cdot(\cos\theta\cdot x+\sin\theta\cdot y);$$

$$\epsilon_q(x,y)=g_q\cdot(x^2+y^2)-a_0;$$

$$\epsilon_j(x,y)=\epsilon_l(x,y)+\epsilon_q(x,y)$$

wherein $\theta$ is the angle of the linear error gradient, $g_l$ is the slope, $g_q$ is a quadratic coefficient and $a_0$ is an offset value. This joint error distribution, represented in FIG. 2, has proven to be a good approximation of real error distribution functions of unary arrays. The difference between the real error distribution and the joint, error distribution is due to the components of higher order thereof and to a random error component.

Figures 1, 1A:
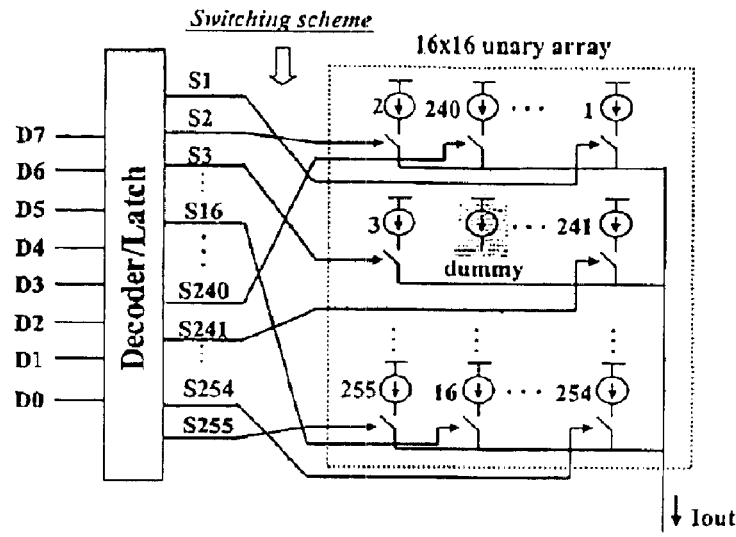
FIG. 1 illustrates a sample prior-art 16×16 unary array.
FIG. 1A compares the INL error functions of two switching sequences for a prior-art mono-dimensional array.
Figures 2, 3:
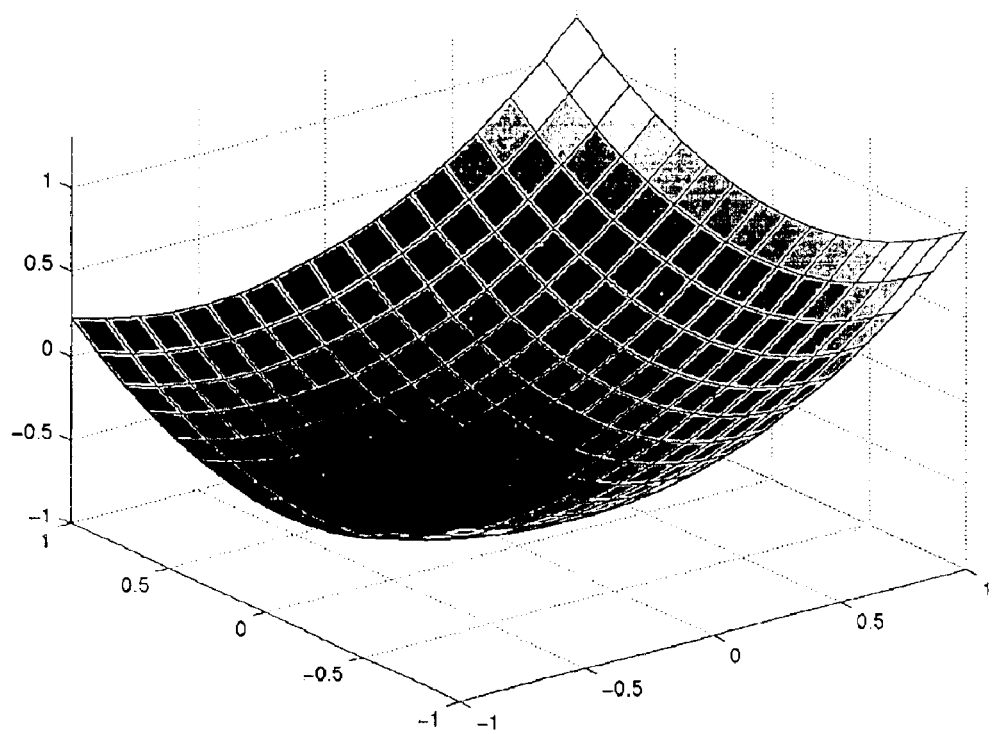
FIG. 2 shows a sample joint error distribution.
FIG. 3 shows how to build a switching sequence according to an embodiment of the method of this invention.

In order to compensate errors due to the linear component of the error distribution, according to an embodiment of a method of the invention, each pair of consecutive odd (2n−1) and even (2n) components of the switching sequence must be symmetrical in respect to the "center of gravity" of the two-dimensional array. In fact $$\epsilon_l(x,y)=-\epsilon_l(-x,-y)$$

and thus, if pairs of consecutive branches {a,b} and {g,h} are disposed as depicted in FIG. 3, the linear component of the error introduced by each pair is null.

Being that $\overline{\epsilon}$ is the continuous component of the quadratic error distribution over the area of the array of branches, that is the mean value thereof, the quadratic error distribution is also given by $$\epsilon_q(x,y)=\overline{\epsilon_q}+\epsilon_q^{AC}(x,y)$$

wherein $\epsilon_q^{AC}(x,y)$ is the alternate component of the quadratic error.

The offset term $\overline{\epsilon_q}$ does not contribute to the INL error because it causes only an offset error in the slope of the transfer function of the D/A converter. On the contrary, the alternate component has positive and negative values that make the transfer function nonlinear, thus originating the INL error.

Therefore it is clear that, in order to have a switching sequence with a desired (small) INL error function, it is necessary to compensate for the alternate component of the quadratic error distribution.

According to an essential embodiment of a method of an embodiment of the invention, the first step consists in defining an upper bound function and a lower bound function, symmetrical to each other, of the INL error function of the switching sequence to be generated. Then the error distribution function over the array is evaluated, in order to calculate the error associated to each pair of symmetrical branches. As stated before, each pair of successive branches must be symmetrical in respect to the center of gravity in order to compensate the component of the INL due to the linear error distribution.

These bound functions define the range of variation of the INL error and they may be constant, if the absolute INL error must be minimized.

The appropriate switching sequence is built by choosing a first pair of branches (1, 2) starting from any branch of the array and performing iteratively the following steps:
  calculating a corresponding value of the INL error function of the switching sequence being built,
  choosing as the successive pair, the pair of conducting branches that maximizes or minimizes the next value of the INL error function of the switching sequence though remaining comprised between the corresponding values of the upper bound and lower bound functions,
  if all other pairs do not meet the preceding conditions, then repeating the steps restarting from the first by choosing every time a different first pair of branches, and if the conditions cannot yet be met, changing at least one of the bound functions and restarting from the first step.

Finally, when the determination of the appropriate switching sequence has been completed, it is output.

Preferably, the above-described method is repeated for all possible first pairs of conducting branches, thus generating a set of switching sequences affected by an INL error function comprised between the same bound functions. The optimal switching sequence is chosen from this set according to a pre-established criterion.

Optionally, the bound functions may be closer to zero in correspondence of midway values of the range of the converter compared to their value in correspondence of the two ends of the range of the converter.

Figure 4:
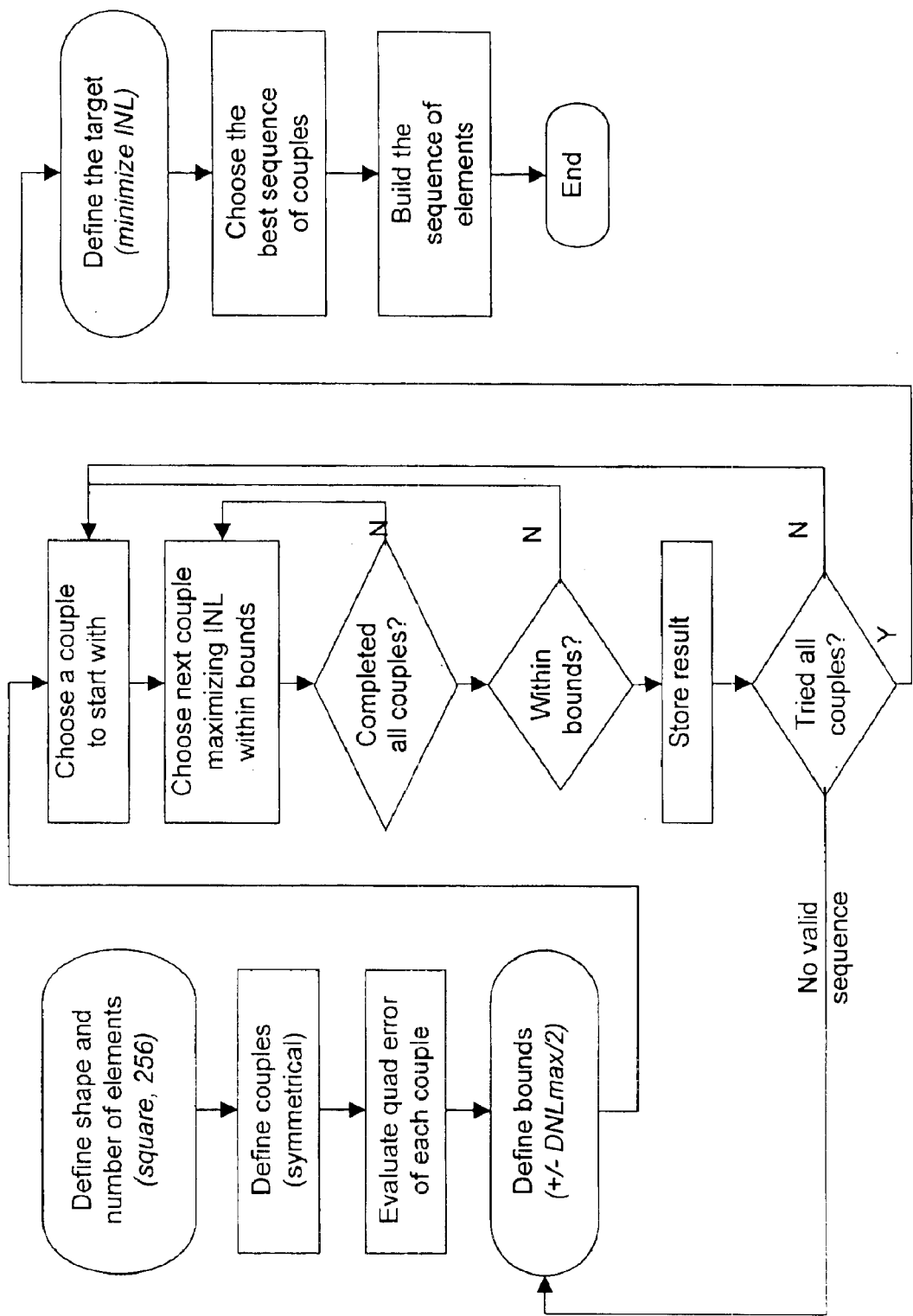
FIG. 4 shows a flow chart of a preferred embodiment of the method of this invention.

A preferred embodiment of a method of this invention is described by the flow chart of FIG. 4. In this case the symmetrical bound functions are constant and this constant value is half the maximum absolute value of the DNL error of the array.

An example of a 16×16 matrix describing a switching sequence determined according to a method of an embodiment of the invention illustrated in FIG. 4 and for $g_l=g_q=0.5$ is depicted in FIG. 5. As may be noticed, the switching sequence has been determined by selecting every even conducting branch (2, 4, 6 . . . ) symmetrical to the preceding odd branch (1, 3, 5 . . . ) in respect to the center of the array.

Preferably, but not necessarily, the map of the switching sequence will be anti-symmetrical in respect to an axis of symmetry of the array, that means that the last branch of the sequence is symmetrical to the first branch in respect to that axis is of symmetry, and so forth for the other branches. For example, the positions of the branches 256, 255, 254, etc. of the switching sequence of FIG. 5 are symmetrical to the positions of the branches 1, 2, 3, etc. in respect to the horizontal axis of symmetry of the array.

For comparison purposes, eight other matrices obtained with different algorithms are depicted in FIGS. 6 to 13.

Figure 14:
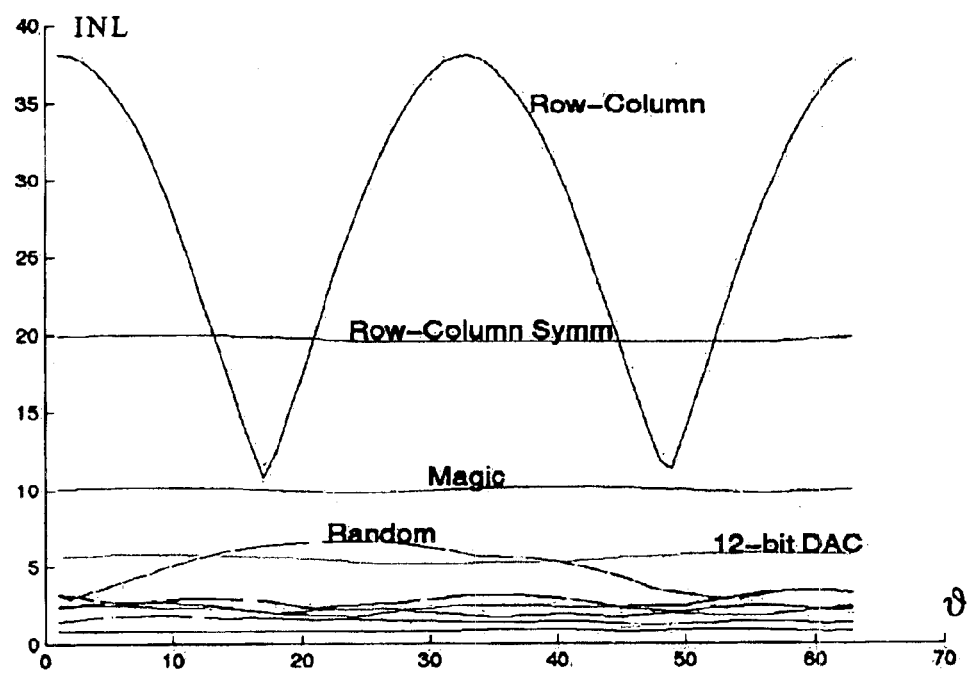
FIGS. 14 and 15 compare the INL error functions of the switching sequences of FIGS. from 5 to 13 in function of the direction θ of the linear error distribution.
Figure 15:
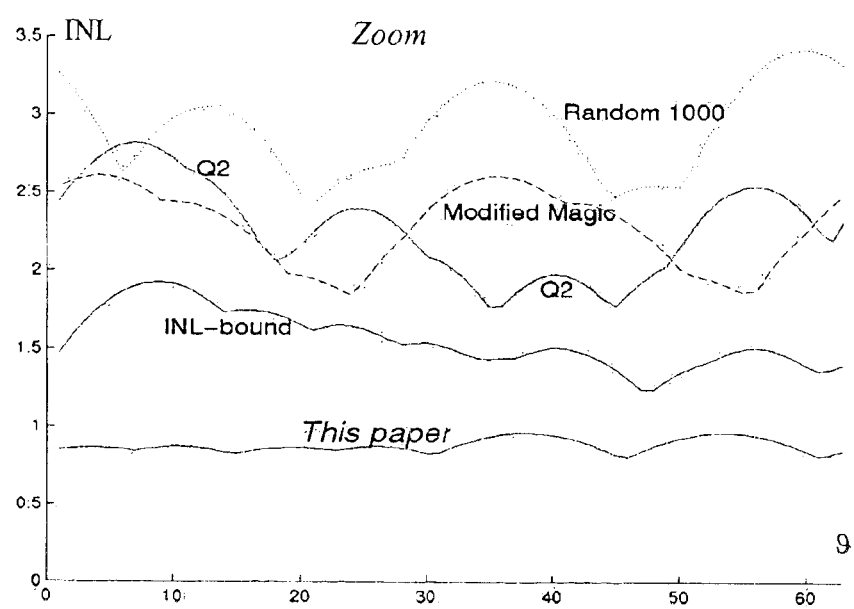

The resulting absolute INL error values in function of the angle $\theta$ of the gradient of the linear error are compared in FIGS. 14 and 15 for $g_l=g_q=0.5$. The values have been calculated after having normalized to 1 the maximum value of the linear or quadratic errors. As may be noticed, the absolute INL error of the switching sequence of FIG. 5 is always smaller than that of the other sequences.

Moreover, differently from the switching sequences of FIGS. 6 to 13 obtained by using the known methods, the absolute INL error of the switching sequence of FIG. 5 is substantially independent from the angle $\theta$. This is very important because it ensures that the method of an embodiment of the invention is not tied to a particular shape of the error distribution, as is the method disclosed in the aforementioned paper by Y. Cong and R. L. Geiger.

FIG. 16 compares many switching sequences, indicating the maximum value of the absolute INL error for each of them. The references [1] and [2] indicate that the switching sequence is obtained using the method described in the above-mentioned papers by G. A. Van der Plas et al. and by Y. Cong and R. L. Geiger, respectively.

As may be noticed, the switching sequence of FIG. 5 is the best one. This result is confirmed even using different values of $g_l$ and $g_q$, as shown in FIG. 17. Even if these parameters undergo sensible variations, the maximum absolute INL error of the switching sequence obtained with an embodiment of the present invention is substantially independent from them. This extraordinary result confirms that the method of an embodiment of this invention effectively compensates both the linear and the quadratic component of the error distribution.

The method of an embodiment of this invention may be applied whichever the shape of the array of conducting branches is, not only to two-dimensional square arrays.

Figure 18:
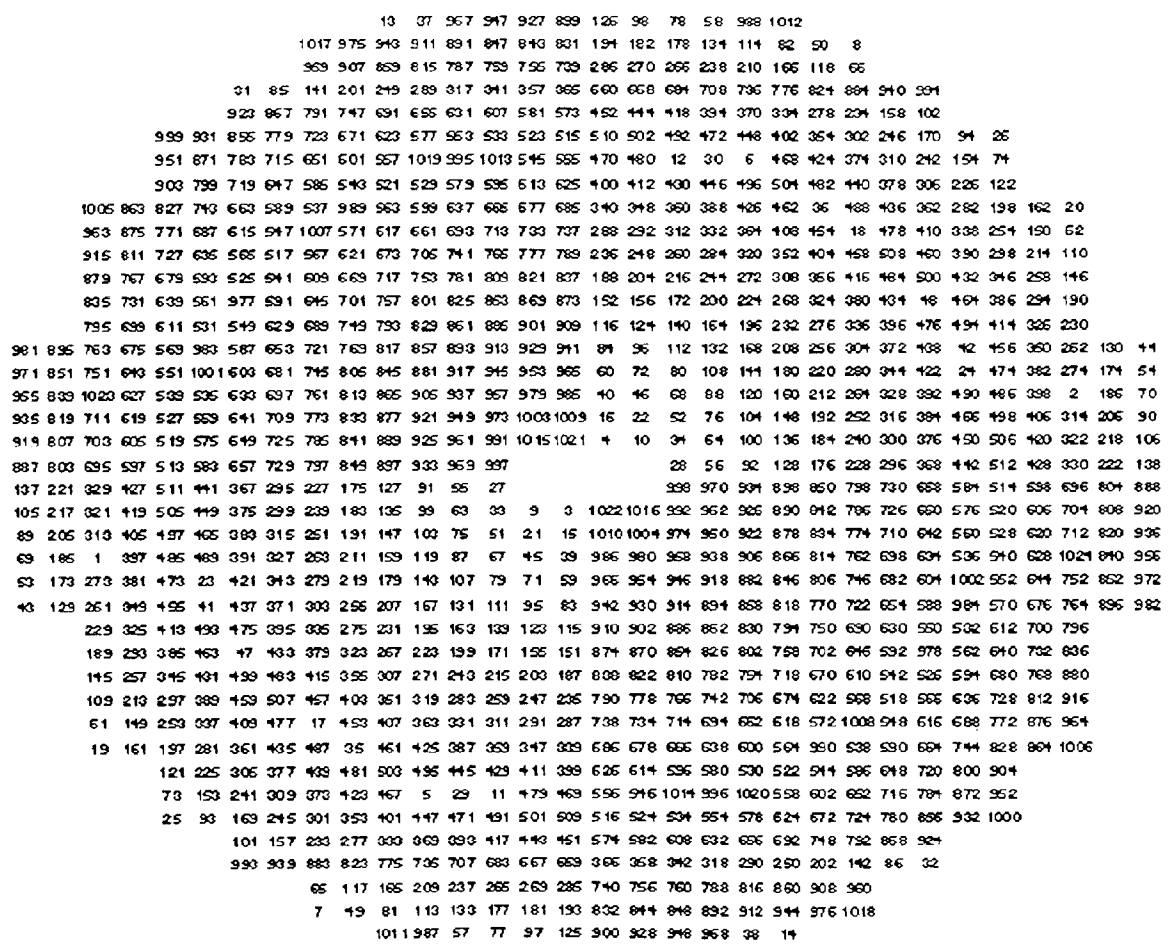

A switching sequence generated according to a preferred embodiment of the method illustrated in FIG. 4 for a substantially oval unary array of conducting branches of a 14-bit D/A converter of an embodiment of the invention, ten of which are thermometrically decoded, is depicted in FIG. 18. As may be noticed, the switching sequence is antisymmetrical in respect to the vertical axis of symmetry. The ten most significant bits of the input bit string of the D/A converter of the invention are thermometrically decoded, while the four least significant bits select as many conducting branches of a binary scaled array.

What is claimed is:

1. A method of generating a switching sequence for a unary array of conducting branches of a thermometrically decoded digital-to-analog converter, the conducting branches of which are affected by an error distributed over the array according to a certain error distribution function, comprising the steps of:

preliminarily evaluating said error distribution function, fixing an upper bound function and a lower bound function symmetrical to each other of an INL error function associated with the switching sequence, determining the center of gravity of the array and calculating, by said preliminarily evaluated error distribution function, error values associated with each pair of conducting branches symmetrical with respect to the center of gravity of the array;

choosing pairs of successive conducting branches in the switching sequence such that every even conducting branch (2n) is substantially symmetrical to a preceding odd conducting branch (2n−1) with respect to said center of gravity;

building a switching sequence with an INL error function comprised between said upper bound and lower bound functions by:

a) starting from a first chosen pair of conducting branches (1, 2) of the switching sequence and iteratively performing the following steps from b1) to b3) for all other pairs of conducting branches of the array:

b1) calculating a corresponding value of the INL error function of the switching sequence being built, b2) choosing as a successive pair, the pair of conducting branches that maximizes or minimizes a next value of the INL error function of the switching sequence comprised between the corresponding values of said upper bound and lower bound functions, b3) if all said other pairs do not meet the conditions of point b2), then repeating the steps from a) to b2) choosing every time a different first pair of branches, and if the conditions cannot yet be met, changing at least one of said bound functions and restarting from point a);

c) when all other pairs of conducting branches of the unary array meet the conditions, outputting the resulting switching sequence.

2. The method of claim 1, further comprising the operations of:

repeating the steps from a) to c) for all possible first pairs of conducting branches using the same bound functions, obtaining a set of switching sequences whose INL error function is comprised between said bound functions;

choosing the switching sequence of said set that satisfies a pre-established criterion.

3. The method of claim 2, wherein said criterion consists of choosing the switching sequence of said set that is affected by the smallest absolute INL error.

4. The method of claim 2, wherein said criterion consists in choosing the switching sequence of said set that is affected by the smallest absolute DNL error with respect to mid way values of the switching sequence.

5. The method of claim 2, wherein said criterion consists of choosing the switching sequence of said set that is affected by a most evenly oscillating INL error function.

6. The method of claim 1, wherein said bound functions are constant.

7. The method of claim 6, wherein the value of said upper bound function is half the maximum value of the absolute value of the DNL error affecting the conducting branches of the array.

8. The method of claim 1, wherein said bound functions are closer to 0 with respect to mid way values of said switching sequence than with respect to the two ends of a range of conversion.

9. The method of claim 1, wherein said pairs of conducting branches are also chosen to make the switching sequence being built anti-symmetrical with respect to an axis of symmetry of the unary array.

10. A thermometrically decoded digital/analog converter, comprising an unary array of conducting branches selectable by respective switches, characterized in that the switching sequence of said branches is generated by using the method of claim 1.

11. A computer program loadable in an internal memory of a computer, comprising a software code for performing the steps of the method of claim 1 when said program is executed on a computer.

12. A method of determining a switching sequence associated with an array of elements, comprising:

choosing a first pair of a plurality of element pairs to be the first and second switched elements in the sequence, each element pair having an associated error value; and choosing as the third and fourth switched elements in the sequence the element pair having the associated error value that, when added to the first pair error value, yields a first summed error value that is within a predetermined value range defined by upper and lower error tolerance values and that is closest or equal in value to one of the upper and lower error tolerance values.

13. The method of claim 12 wherein each element pair comprises an element having a predetermined relationship with the other element of the pair.

14. The method of claim 13 wherein the predetermined relationship comprises symmetrical positioning with respect to a center of the array.

15. The method of claim 12 wherein the first pair of elements is chosen randomly.

16. The method of claim 12 further comprising:

identifying an element pair having an associated error value that, when added to a summed error value, yields a second summed error value not within the predetermined value range; and choosing a second pair of the plurality of element pairs to be the first and second switched elements in the sequence.

17. The method of claim 12, further comprising modifying one of the upper and lower error tolerance values.

18. The method of claim 12 wherein the error values comprise integral non-linearity error values.

19. The method of claim 12 wherein the elements comprise current sources.

20. An article of manufacture, comprising: a machine-readable medium having instructions stored thereon to:

choose a first pair of a plurality of arrayed element pairs to be the first and second switched elements in a switching sequence, each element pair having an associated error value; and choose as the third and fourth switched elements in the sequence the element pair having the associated error value that, when added to the first pair error value, yields a first summed error value that is within a predetermined value range defined by upper and lower error tolerance values and that is closest or equal in value to one of the upper and lower error tolerance values.

21. A system, comprising:

means for choosing a first pair of a plurality of element pairs to be a first and second switched elements in a sequence, each element pair having an associated error value; and means for choosing as a third and fourth switched elements in the sequence the element pair having the associated error value that, when added to the first pair error value, yields a first summed error value that is within a predetermined value range defined by upper and lower error tolerance values and that is closest or equal in value to one of the upper and lower error tolerance values.

22. A digital-to-analog converter, comprising:

a array of elements comprising a first pair of a plurality of element pairs operable to be chosen as a first and second switched elements in a switching sequence, each element pair having an associated error value; and a second element pair operable to be chosen as a third and fourth switched elements in the sequence, the second element pair having the associated error value that, when added to the first pair error value, yields a first summed error value that is within a predetermined value range defined by upper and lower error tolerance values and that is closest or equal in value to one of the upper and lower error tolerance values.

* * * * *